(12) United States Patent
Lin (10) Patent No.: US 8,505,615 B2
(45) Date of Patent: Aug. 13, 2013

(54) COOLING FAN RACK

(75) Inventor: Sheng-Huang Lin, Sinjhuang (TW)

(73) Assignee: Asia Vital Components (China) Co., Ltd., Shenzhen (CN)

(*) Notice: Subject to any disclaimer, the term of this patent is extended or adjusted under 35 U.S.C. 154(b) by 247 days.

(21) Appl. No.: 12/409,820

(22) Filed: Mar. 24, 2009

(65) Prior Publication Data

US 2010/0193158 A1 Aug. 5, 2010

(30) Foreign Application Priority Data

Feb. 3, 2009 (TW) .............................. 98201624 U (51) Int. Cl.
*F28F 7/00* (2006.01)
*H05K 7/20* (2006.01)

(52) U.S. Cl.
USPC .............................. 165/80.3; 165/121; 165/67

(58) Field of Classification Search
CPC .................................................... H01L 23/467
USPC .................... 165/80.3, 121, 122, 104.34, 67, 165/104.21; 361/695, 697
See application file for complete search history.

(56) References Cited

U.S. PATENT DOCUMENTS

| | | | |
|---|---|---|---|
| 6,480,383 B2 | 11/2002 | Kodaira et al. | |
| 6,538,888 B1 * | 3/2003 | Wei et al. | 361/697 |
| 6,672,374 B1 * | 1/2004 | Lin | 165/121 |
| 6,722,418 B2 * | 4/2004 | Zhang | 165/80.3 |
| 7,131,485 B2 * | 11/2006 | Yu et al. | 165/80.3 |
| 7,281,893 B2 * | 10/2007 | Pan | 415/177 |
| 7,532,472 B2 * | 5/2009 | Lin et al. | 361/697 |
| 7,606,028 B2 * | 10/2009 | Liu | 361/697 |
| 7,758,304 B2 * | 7/2010 | Pan | 415/177 |
| 2002/0139518 A1 * | 10/2002 | Lee et al. | 165/121 |
| 2003/0230398 A1 * | 12/2003 | Lee et al. | 165/104.21 |

* cited by examiner

*Primary Examiner* — Tho V Duong (57) ABSTRACT

A cooling fan rack includes a frame defining a union section; a plurality of stoppers arranged at four corners in the frame to cooperate with the frame to define an accommodating space; and a plurality of airflow paths formed between two adjacent stoppers to communicate with the accommodating space. The frame is provided at two lateral lower sides with a notch each, which communicate with the accommodating space. The two notches are sized for straddling two upper outer sides of a radiating fin assembly, so that the radiating fin assembly with a reduced volume can be upward fitly received in the accommodating space. A cooling fan is downward firmly fitted in the union section. Part of the cooling airflow produced by the cooling fan can flow through the airflow paths to two opposite ends of the radiating fin assembly, enabling upgraded heat dissipation effect.

1 Claim, 7 Drawing Sheets

COOLING FAN RACK

FIELD OF THE INVENTION

The present invention relates to a cooling fan rack, and more particularly to a cooling fan rack that enables part of the cooling airflow produced by a cooling fan fitted to an upper side of the rack to flow toward two opposite ends of a radiating fin assembly assembled to a lower side of the rack.

BACKGROUND OF THE INVENTION

When an electronic device operates, internal electronic elements thereof will produce a large amount of heat. Thus, an additional heat dissipating unit is required to enhance heat dissipation of the electronic device, lest the electronic device should have lowered working efficiency or become damaged due to overheating. The heat dissipating unit is usually a radiating fin assembly or a heat sink. However, the heat dissipation effect of the heat dissipating unit alone is limited. Normally, at least one cooling fan is further assembled to the heat dissipating unit, so that the cooling fan produces cooling airflow toward the heat dissipating unit to forcedly carry away the heat transferred to the heat dissipating unit and thereby upgrade the overall heat dissipation performance of the electronic device.

Figure 1:
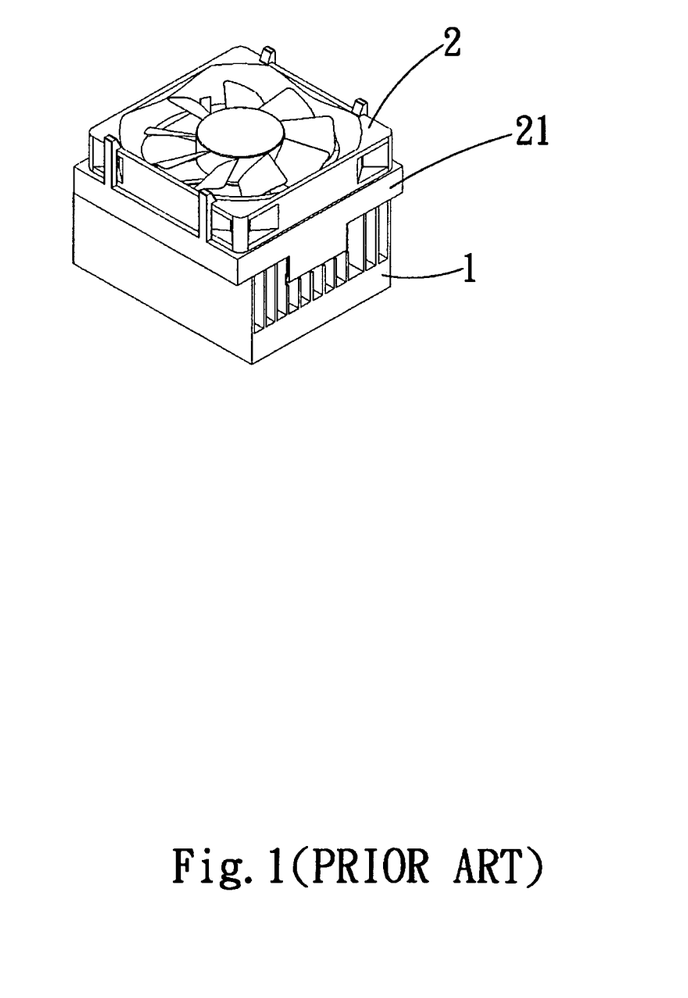
FIG. 1 is an assembled perspective view of a conventional thermal module.
Figure 1A:
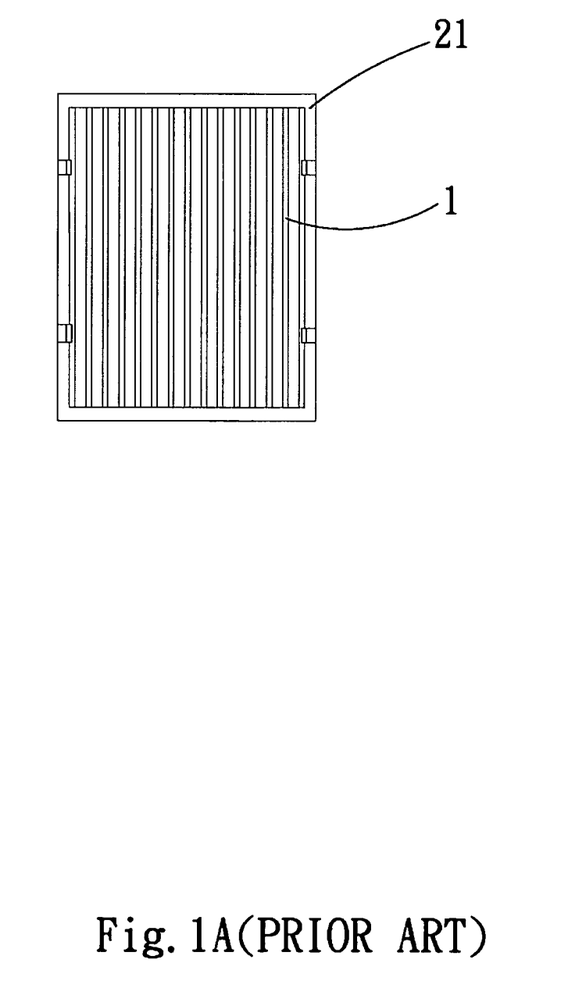
FIG. 1A is a top view of a conventional heat dissipating unit included in the thermal module of FIG. 1 being connected to a conventional cooling fan rack.

FIG. 1 is an assembled perspective view of a conventional thermal module including a heat dissipating unit 1, which is usually a heat sink or a radiating fin assembly, and a cooling fan 2 fitted to a whole top of the heat dissipating unit 1 via a cooling fan rack 21 to produce and guide cooling airflow to the heat dissipating unit 1 to forcedly carry heat therefrom. FIG. 1A is a top view of the conventional heat dissipating unit 1 with the cooling fan rack 21 connected thereto. Since the cooling fan 2 usually has a fixed size, the heat dissipating unit 1 and the cooling fan rack 21 are usually designed to match the size of the cooling fan 2. This is of course inconvenient to do so. Moreover, the heat dissipating unit 1 includes a plurality of upright and parallelly spaced radiating fins, so that a cooling air passage is formed between any two adjacent radiating fins. The cooling air passages allow the cooling airflow produced by the cooling fan 2 to flow only in a horizontal direction. More specifically, the cooling airflow is directly vertically blown into the air passages among the radiating fins and then flows horizontally toward two lateral sides of the heat dissipating unit 1. Due to the parallel arrangement of the radiating fins, the cooling airflow is stopped from flowing toward two opposite outer ends of the heat dissipating unit 1. As a result, heat is accumulated at a central portion of the heat dissipating unit 1 without being quickly carried away therefrom. The accumulated heat largely lowers the heat dissipation effect. Moreover, due to a blade hub thereof, the conventional cooling fan 2 usually has relatively small airflow near a central portion thereof and relatively large airflow near an outer periphery thereof.

In brief, the thermal module with the conventional cooling fan 2 and heat dissipating unit 1 has the following disadvantages: (1) being subject to accumulation of heat; (2) having low heat dissipation effect; and (3) requiring higher manufacturing cost.

It is therefore tried by the inventor to develop an improved cooling fan rack to eliminate the above disadvantages.

SUMMARY OF THE INVENTION

A primary object of the present invention is to provide a cooling fan rack, with which part of the cooling airflow produced by a cooling fan fitted to an upper side of the rack can be guided to two opposite ends of a radiating fin assembly assembled to a lower side of the rack.

Another object of the present invention is to provide a cooling fan rack that has a structure allowing a radiating fin assembly assembled thereto to have a reduced volume and accordingly reduced material cost.

To achieve the above and other objects, the cooling fan tack according to the present invention is designed for connecting to a thermal module. The cooling fan rack includes a frame defining a union section; a plurality of stoppers arranged in the frame, the stoppers and the frame together defining an accommodating space for receiving part of the thermal module therein; and a plurality of airflow paths formed between two adjacent stoppers to communicate with the accommodating space and adjoin two opposite ends of the thermal module. The frame is provided at two lateral lower sides with a notch each, which communicate an external environment with the accommodating space. The thermal module includes a radiating fin assembly and a cooling fan. The two notches on the frame are sized for separately straddling two upper outer sides of the radiating fin assembly, so that an upper portion of the radiating fin assembly is received in the accommodating space. With the notches, the radiating fin assembly can be firmly fitted in the cooling fan rack while only having a reduced overall volume. The cooling fan is firmly fitted in the union section to downward press against the stoppers. While part of the cooling airflow produced by the cooling fan flows into the radiating fin assembly, the remaining part of the cooling airflow can flow through the airflow paths formed between the adjacent stoppers to two opposite ends of the radiating fin assembly. Therefore, an upgraded heat dissipation effect can be achieved.

In brief, the cooling fan rack of the present invention has the following advantages: (1) assisting the thermal module in providing good heat dissipation effect; (2) allowing the radiating fan assembly to have a reduced size to save material therefor; (3) allowing the thermal module to be manufactured at reduced cost; and (4) helping in overcoming the problem of accumulated heat at the central portion of the thermal module.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
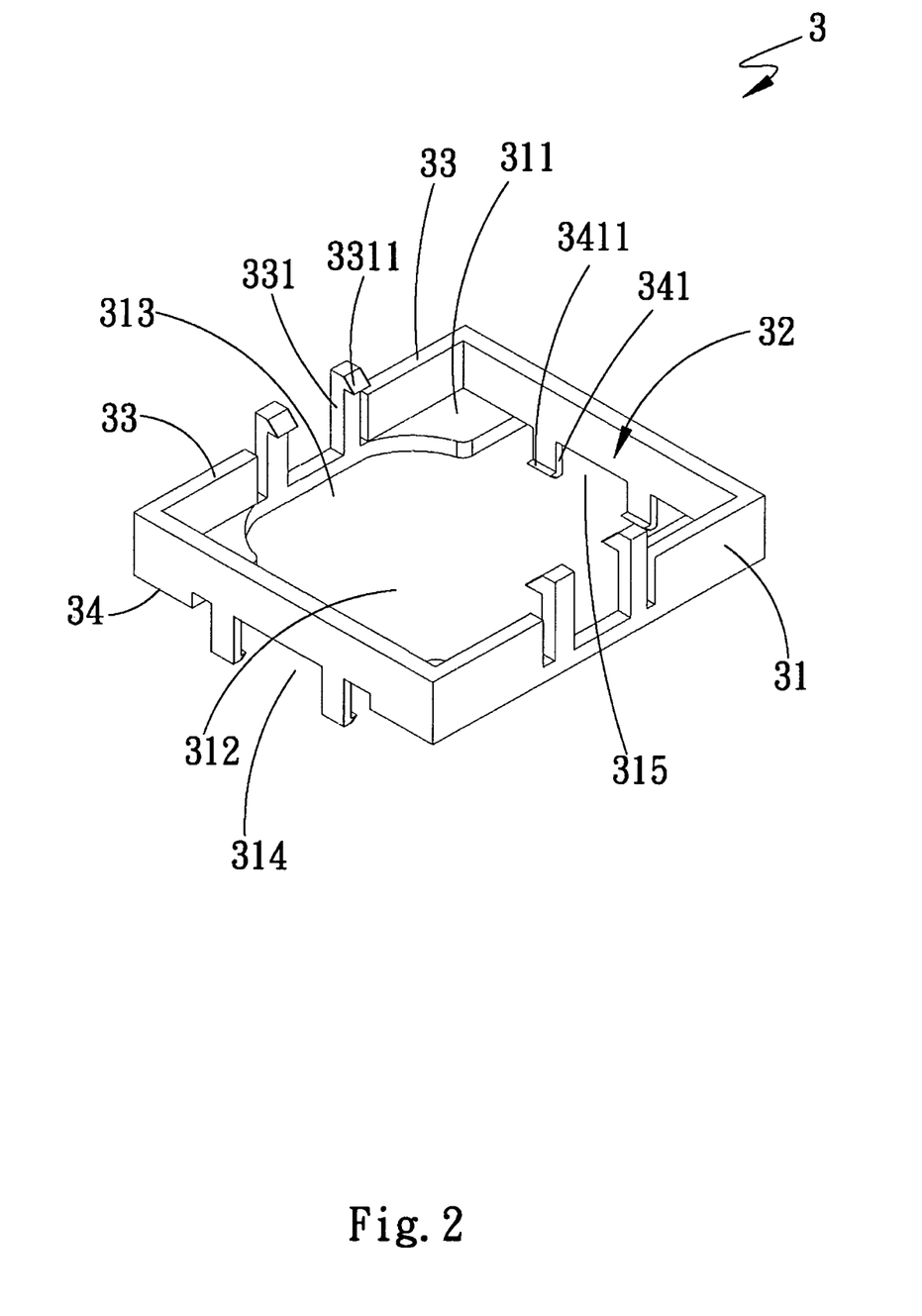
FIG. 2 is a perspective view of a cooling fan rack according to a preferred embodiment of the present invention.

Please refer to FIGS. 2 through 6. A cooling fan rack 3 according to a preferred embodiment of the present invention as shown in FIG. 2 is designed for connecting to a thermal module 4.

The cooling fan rack 3 includes a frame 31 defining a union section 32; at least one stopper 311 located at a corner in the frame 31, in the illustrated preferred embodiment, there are four stoppers 311 separately located at four corners in the frame 31, and the stoppers 311 and the frame 31 together defining an accommodating space 312 for receiving an upper portion of a radiating fin assembly 41 of the thermal module 4 therein; and at least one airflow path 313 formed between two adjacent stoppers 311 to communicate with the accommodating space 312 and adjoin two opposite ends of the radiating fin assembly 41. The frame 31 is formed at two lateral lower sides with at least one first notch 314 and one second opening 315, which communicate with the accommodating space 312.

Figure 3:
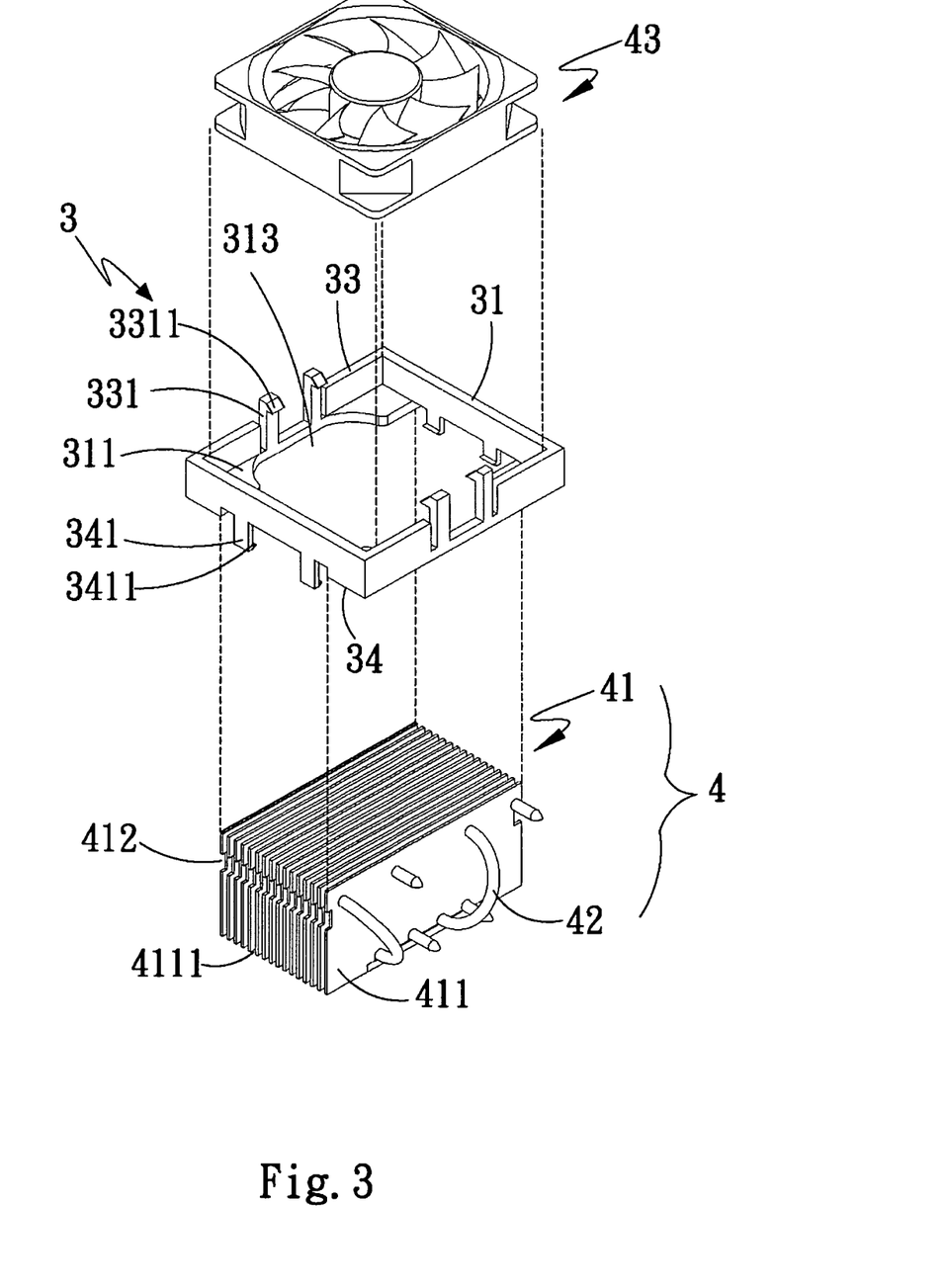
FIG. 3 is an exploded perspective view showing the use of the cooling fan rack of the present invention to connect to a thermal module.
Figure 4:
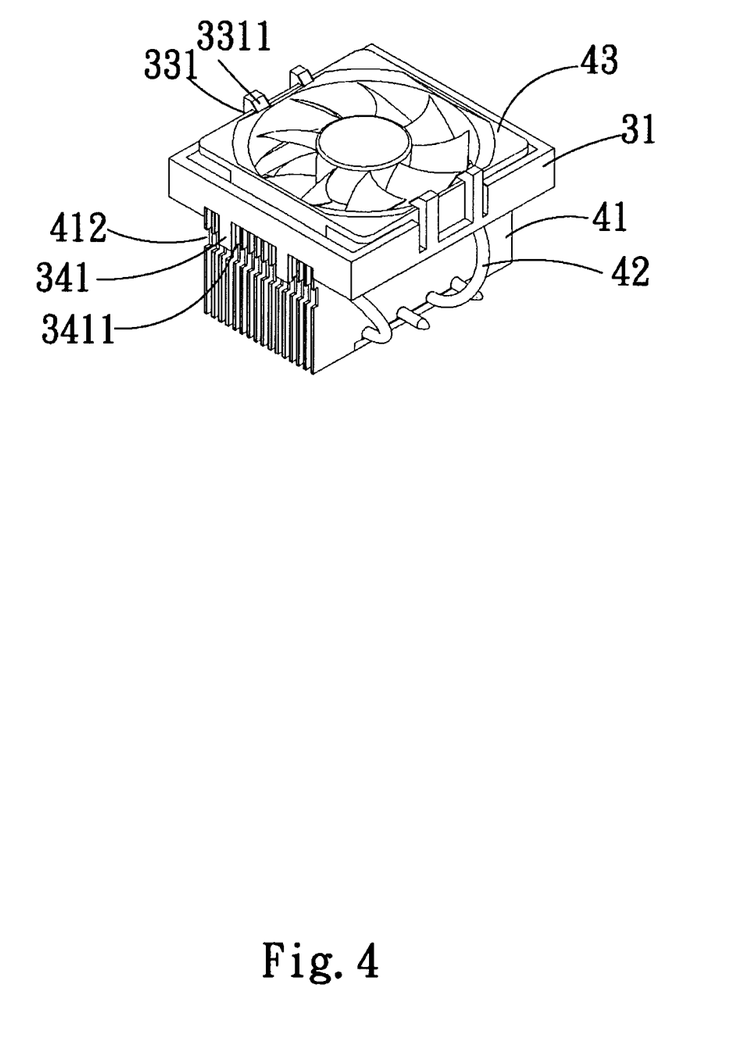
FIG. 4 an assembled view of FIG. 3.

The thermal module 4 includes a radiating fin assembly 41, at least one heat pipe 42, and at least one cooling fan 43. The radiating fin assembly 41 consists of a plurality of upright and parallelly spaced radiating fins 411 and is formed at each of two lateral sides with at least one horizontal groove 412. A cooling air passage 4111 is formed between any two adjacent ones of the radiating fins 411. The heat pipe 42 is extended into the radiating fin assembly 41 from one end to the other opposite end for speeding heat transfer. The cooling fan 43 is downward fitted in the union section 32 to press against the stoppers 311. The first and the second notch 314, 315 are sized to fitly straddle the radiating fin assembly 41 on two upper outer sides thereof, so that the upper portion of the radiating fin assembly 41 is received in the accommodating space 312 and associated with the frame 31.

The frame 31 has an upper side 33, a lower side 34, at least one retaining arm 331, and at least one hook 341. The retaining arm 331 is upward extended from the upper side 33 of the frame 31, and the hook 341 is downward extended from the lower side 34 of the frame 31. In the illustrated preferred embodiment, there are provided four retaining arms 331 grouped into two pairs separately located at two opposite ends of the frame 31. Similarly, in the illustrated preferred embodiment, there are provided four hooks 341 grouped into two pairs separately located at two opposite lateral sides of the frame 31. However, it is understood the number of the retaining arms 331 and of the hooks 341 are not limited to four but can be increased or reduced. The retaining arms 331 are upward extended along two opposite ends of the cooling fan 43 and each have a hooked free end 3311 for hooking to the cooling fan 43, which is fitted in the union section 32, lest the cooling fan 43 should fall off the cooling fan rack 3. The hooks 341 are downward extended along two lateral sides of the radiating fin assembly 41 and each have a hooked free end 3411 for hooking to the grooves 412 formed on the two lateral sides of the radiating fin assembly 41, so as to fixedly connect the cooling fan rack 3 to the radiating fin assembly 41.

Figure 5:
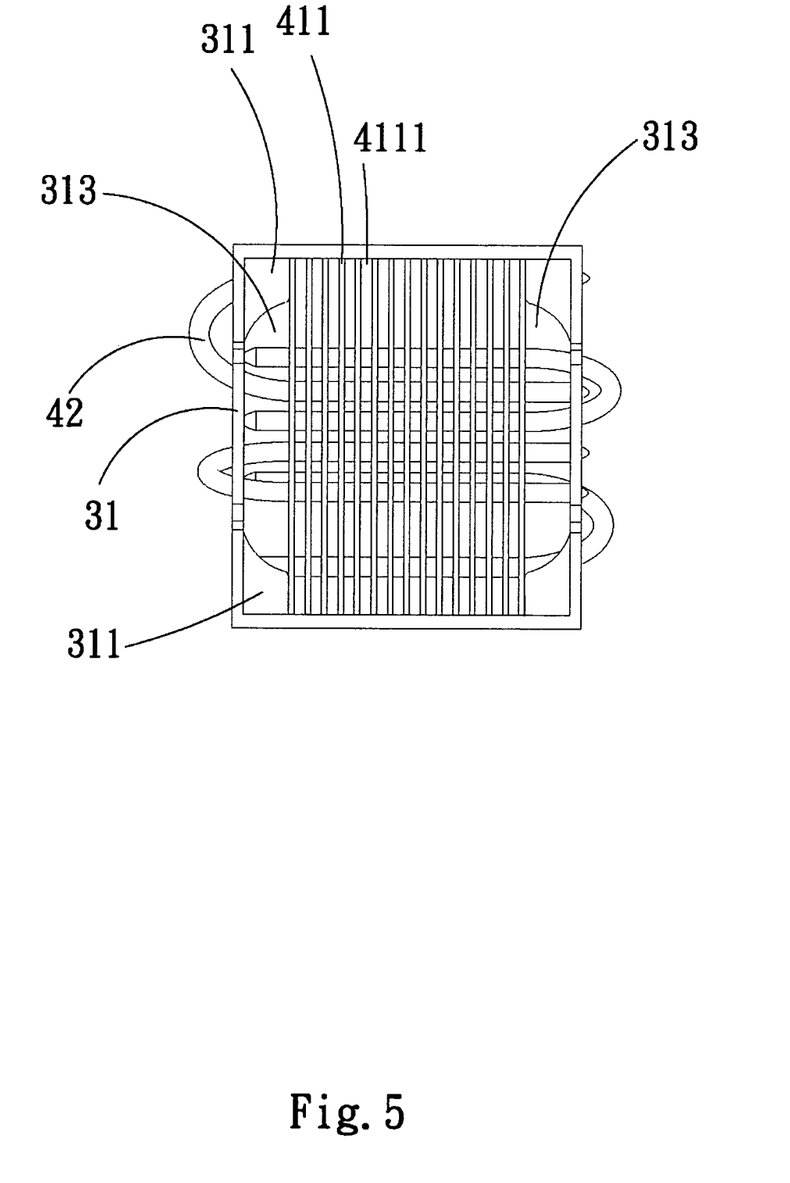
FIG. 5 is a top view of FIG. 4 with the cooling fan removed from the cooling fan rack.
Figure 6:
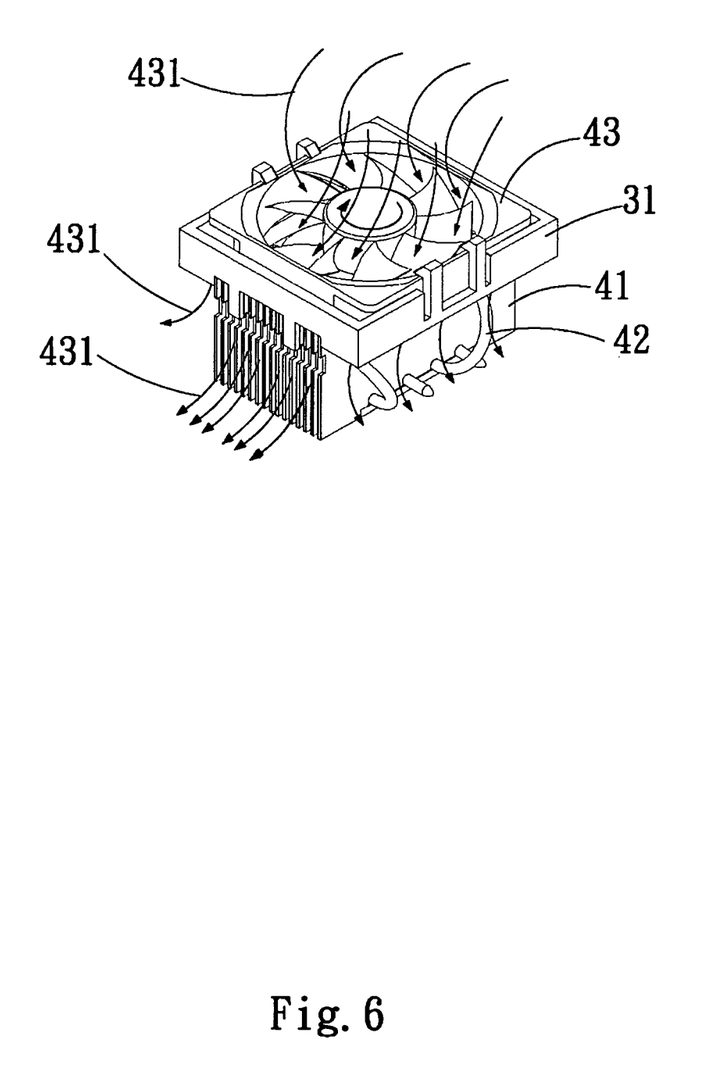
FIG. 6 shows a thermal module with the cooling fan rack of the present invention in use.

When the frame 31 is connected to a top of the radiating fin assembly 41, two separate airflow openings, that is, the above-mentioned airflow paths 313, are formed between the stoppers 311 at the corners in the frame 31 and the two opposite ends of the radiating fin assembly 41. When the cooling fan 43 produces and guides cooling airflow 431 to the radiating fin assembly 41 to force heat away from the radiating fin assembly 41, part of the cooling airflow 431 vertically flows toward the radiating fin assembly 41 down into the cooling air passages 4111 to carry heat away from the radiating fin assembly 41 via two lateral sides thereof. Meanwhile, the remaining part of the cooling airflow 431 flows through the airflow paths 313 toward two opposite ends of the radiating fin assembly 41, as can be seen in FIG. 6. In this manner, an upgraded overall heat dissipation effect can be fully achieved.

Moreover, with the accommodating space 312 and the notches 314, 315 of the frame 31, the radiating fin assembly 41 with a reduced overall volume can still be firmly fitted in the frame 31 without the need of having big dimensions matching the relatively large cooling fan 43 to fill a whole inner space of the frame 31 for the purpose of associating with the cooling fan 43. Therefore, material needed to produce the radiating fin assembly can be largely reduced to save a lot of material cost.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A cooling fan rack for connecting to a thermal module, comprising:
    a frame defining a union section;
    four stoppers separately provided in the frame at four corners thereof, the stoppers and the frame together defining an accommodating space; and
    at least one airflow path outside the thermal module formed adjacent to the at least one stopper to communicate with and through to the accommodating space and adjoin at least one of two opposite ends of the thermal module and further communicate with spaces at the two opposite ends of the thermal module thereby creating airflow paths directed toward opposite ends of the assembly beyond and separate from a central portion;
    wherein the frame is formed at two lateral lower sides with at least a first notch defining a first opening and a second notch defining a second opening, which openings communicate with the accommodating space;
    wherein the frame has an upper side, a lower side, a plurality of spaced upper retaining arms, each upper retaining arm having a hooked free end; the retaining arms being extended upward from the upper side of the frame along two opposite ends of a said frame to hook over a cooling fan, and a plurality of spaced lower hooks, spaced by said first notch and said second notch the lower hooks being extended downward from the lower side of the frame and extended downward along two lateral sides of the frame;
    wherein the thermal module includes a radiating fin assembly; wherein the radiating fin assembly is formed at each of two lateral sides with at least one horizontal groove; and at least one heat pipe, and the module comprising at least one cooling fan; the cooling fan being fitted in the union section between said retaining arms and retained by said hooked free ends of said retaining arms, such that the cooling fan is pressed downward against the stoppers, and wherein the first and second notches of said frame separately straddle two upper outer sides of the radiating fin assembly, said lower hooks fitting into said at least one horizontal groove formed in said radiating fin assembly so as to fixedly connected the cooling fan rack to the radiating fin assembly in a snap fit manner, and the heat pipe is extended into the radiating fin assembly from one end to the other opposite end thereof.

* * * * *